United States Patent
Ma et al.

(10) Patent No.: US 7,679,957 B2
(45) Date of Patent: Mar. 16, 2010

(54) REDUNDANT NON-VOLATILE MEMORY CELL

(75) Inventors: Yanjun Ma, Bellevue, WA (US);
William T. Colleran, Seattle, WA (US);
Vadim Gutnik, Irvine, CA (US)

(73) Assignee: Virage Logic Corporation, Fremont, CA (US)

( * ) Notice: Subject to any disclaimer, the term of this patent is extended or adjusted under 35 U.S.C. 154(b) by 944 days.

(21) Appl. No.: 11/106,982

(22) Filed: Apr. 15, 2005

(65) Prior Publication Data

US 2006/0221715 A1    Oct. 5, 2006

Related U.S. Application Data

(60) Provisional application No. 60/667,435, filed on Mar. 31, 2005.

(51) Int. Cl.
*G11C 16/06* (2006.01)

(52) U.S. Cl. .............. 365/185.09; 365/185.28; 365/185.21; 365/185.25

(58) Field of Classification Search ............ 365/185.09, 365/185.21, 185.25, 185.28
See application file for complete search history.

(56) References Cited

U.S. PATENT DOCUMENTS

| | | | |
|---|---|---|---|
| 4,037,242 A | 7/1977 | Gosney | ......... 357/23 |
| 4,899,070 A | 2/1990 | Ou et al. | |
| 4,935,702 A | 6/1990 | Mead et al. | |
| 5,016,217 A | 5/1991 | Brahmbhatt | |
| 5,068,622 A | 11/1991 | Mead et al. | ......... 330/253 |
| 5,101,378 A | 3/1992 | Radjy et al. | |
| 5,197,028 A | 3/1993 | Nakai | |
| 5,272,368 A | 12/1993 | Turner et al. | |
| 5,430,670 A | 7/1995 | Rosenthal | |
| 5,438,542 A | 8/1995 | Atsumi et al. | |
| 5,450,363 A | 9/1995 | Christopherson et al. | |
| 5,463,348 A | 10/1995 | Sarpeshkar et al. | |
| 5,515,317 A | 5/1996 | Wells et al. | |
| 5,517,044 A | 5/1996 | Koyama | |
| 5,574,878 A | 11/1996 | LeMoncheck et al. | |
| 5,574,879 A | 11/1996 | Wells et al. | |
| 5,596,524 A | 1/1997 | Lin et al. | |
| 5,617,358 A | 4/1997 | Kodama | |
| 5,627,392 A | 5/1997 | Diorio et al. | |
| 5,633,518 A | 5/1997 | Broze | |
| 5,666,307 A | 9/1997 | Chang | |

(Continued)

FOREIGN PATENT DOCUMENTS

EP    0 298 618    10/1993

(Continued)

OTHER PUBLICATIONS

Yajun Ma et al., "Reliability of pFET EEPROM with 70-A Tunnel Oxide Manufactured in Generic Logic CMOS Processes," *IEEE*, Sep. 2004 (6 pages).

(Continued)

*Primary Examiner*—Connie C Yoha
(74) *Attorney, Agent, or Firm*—Nixon Peabody LLP; David B. Ritchie

(57) ABSTRACT

Two floating gate devices are arranged in a redundant configuration in a non-volatile memory (NVM) such that stress induced leakage current (SILC) or other failures do not result in a complete loss of memory storage. The redundant NVM may be arranged as a series configuration, a parallel configuration, a single-ended device, a differential device, a simple logic circuit function, a complex logic circuit function, and/or as part of an RFID tag system.

35 Claims, 17 Drawing Sheets

U.S. PATENT DOCUMENTS

| | | | |
|---|---|---|---|
| 5,687,118 A | 11/1997 | Chang | |
| 5,691,939 A | 11/1997 | Chang et al. | |
| 5,706,227 A | 1/1998 | Chang et al. | |
| 5,717,636 A | 2/1998 | Dallabora et al. | |
| 5,736,764 A | 4/1998 | Chang | |
| 5,761,121 A | 6/1998 | Chang | |
| 5,777,361 A | 7/1998 | Parris et al. | |
| 5,787,038 A | 7/1998 | Park | |
| 5,790,060 A | 8/1998 | Tesch | |
| 5,796,656 A | 8/1998 | Kowshik et al. | 365/185.23 |
| 5,798,967 A | 8/1998 | Sarin et al. | |
| 5,801,994 A | 9/1998 | Chang et al. | |
| 5,825,063 A | 10/1998 | Diorio et al. | 257/316 |
| 5,841,165 A | 11/1998 | Chang et al. | |
| 5,844,300 A | 12/1998 | Alavi et al. | |
| 5,864,569 A | 1/1999 | Roohparvar | |
| 5,886,566 A | 3/1999 | Park et al. | |
| 5,898,613 A | 4/1999 | Diorio et al. | 365/185.03 |
| 5,901,084 A | 5/1999 | Ohnakado | |
| 5,912,842 A | 6/1999 | Chang et al. | |
| 5,939,945 A | 8/1999 | Thewes et al. | |
| 5,966,329 A | 10/1999 | Hsu et al. | |
| 5,969,987 A | 10/1999 | Blyth et al. | |
| 5,972,804 A | 10/1999 | Tobin et al. | |
| 5,982,669 A | 11/1999 | Kalnitsky et al. | |
| 5,990,512 A | 11/1999 | Diorio et al. | |
| 6,002,623 A | 12/1999 | Stave et al. | |
| 6,028,789 A | 2/2000 | Mehta et al. | |
| 6,055,185 A | 4/2000 | Kalnitsky et al. | |
| 6,081,451 A | 6/2000 | Kalnitsky et al. | |
| 6,097,637 A | 8/2000 | Bauer et al. | |
| 6,125,053 A | 9/2000 | Diorio et al. | |
| 6,130,612 A | 10/2000 | Castellano et al. | |
| 6,137,153 A | 10/2000 | Le et al. | 257/532 |
| 6,137,722 A | 10/2000 | Kalnitsky et al. | |
| 6,137,723 A | 10/2000 | Bergemont et al. | |
| 6,137,724 A | 10/2000 | Kalnitsky et al. | |
| 6,144,581 A | 11/2000 | Diorio et al. | |
| 6,166,954 A | 12/2000 | Chern | |
| 6,166,978 A | 12/2000 | Goto | |
| 6,190,968 B1 | 2/2001 | Kalnitsky et al. | |
| 6,208,557 B1 | 3/2001 | Bergemont et al. | |
| 6,233,717 B1 | 5/2001 | Choi | |
| 6,294,427 B1 | 9/2001 | Furuhata et al. | |
| 6,320,788 B1 | 11/2001 | Sansbury et al. | |
| 6,353,568 B1 | 3/2002 | Sung | |
| 6,359,810 B1 | 3/2002 | Gupta et al. | |
| 6,363,008 B1 | 3/2002 | Wong | |
| 6,452,835 B1 | 9/2002 | Diorio et al. | |
| 6,459,457 B1 | 10/2002 | Srinivasan et al. | |
| 6,469,937 B2 | 10/2002 | Fuchigami et al. | |
| 6,479,863 B2 | 11/2002 | Caywood | |
| 6,522,584 B1 | 2/2003 | Chen et al. | |
| 6,534,816 B1 | 3/2003 | Caywood | |
| 6,558,967 B1 | 5/2003 | Wong | |
| 6,563,731 B1 | 5/2003 | Bergemont | |
| 6,594,196 B2 | 7/2003 | Hsu et al. | |
| 6,611,463 B1 | 8/2003 | Mehta et al. | |
| 6,646,919 B1 | 11/2003 | Madurawe et al. | |
| 6,654,286 B2 | 11/2003 | Kawakami | |
| 6,678,190 B2 | 1/2004 | Yang et al. | |
| 6,693,829 B2 | 2/2004 | Babudri et al. | |
| 6,714,451 B2 | 3/2004 | Ooishi et al. | |
| 6,791,881 B2 | 9/2004 | Shukuri et al. | |
| 6,845,039 B2 | 1/2005 | Chen et al. | |
| 6,845,044 B2 | 1/2005 | Horch et al. | 365/185.24 |
| 6,853,583 B2 | 2/2005 | Diorio et al. | |
| 6,865,128 B2 | 3/2005 | Kanai | |
| 6,870,767 B2 | 3/2005 | Rudelic et al. | |
| 6,898,105 B2 | 5/2005 | Sakai et al. | |
| 6,950,342 B2 * | 9/2005 | Lindhorst et al. | 365/185.21 |
| 6,995,436 B2 | 2/2006 | Kawasaki | |
| 6,999,887 B2 | 2/2006 | Rehm et al. | |
| 7,057,935 B2 | 6/2006 | Chevallier | |
| 7,272,041 B2 | 9/2007 | Rahman et al. | |
| 7,403,122 B1 | 7/2008 | Koepp et al. | |
| 7,463,155 B2 | 12/2008 | Narlow et al. | |
| 2002/0008271 A1 | 1/2002 | Hsu et al. | |
| 2003/0206437 A1 | 11/2003 | Diorio et al. | |
| 2004/0004861 A1 * | 1/2004 | Srinivas et al. | 365/185.21 |
| 2004/0021166 A1 | 2/2004 | Hyde et al. | |
| 2004/0037127 A1 | 2/2004 | Lindhorst et al. | |
| 2004/0052113 A1 | 3/2004 | Diorio et al. | |
| 2004/0195593 A1 | 10/2004 | Diorio et al. | |
| 2005/0063235 A1 | 3/2005 | Pesavento et al. | |
| 2006/0077737 A1 | 4/2006 | Ooishi | |
| 2006/0209598 A1 | 9/2006 | Wang et al. | |
| 2006/0221715 A1 | 10/2006 | Ma et al. | |
| 2007/0229230 A1 | 10/2007 | Drago et al. | |

FOREIGN PATENT DOCUMENTS

| | | |
|---|---|---|
| EP | 0 776 049 | 8/2000 |
| EP | 0 778 623 | 7/2001 |

OTHER PUBLICATIONS

Carley, L. Richard, "Trimming Analog Circuits Using Floating-Gate Analog MOS Memory", IEEE Journal of Solid-State Circuits, vol. 24, No. 6, Dec. 1989, pp. 1569-1575.

Chang, L. et al., "Non-Volatile Memory Device With True CMOS Compatibility", Electronics Letters, vol. 35, No. 17, Aug. 19, 1999, pp. 1443-1445.

Chang, Leland et al., "A CMOS-Compatible Single-Poly Cell For Use As Non-Volatile Memory", International Semiconductor Device Research Symposium, Dec. 1-3, 1999, pp. 57-60.

Chung, S.S. et al., "N-Channel Versus P-Channel Flash EEPROM-Which One Has Better Reliabilities", 39th Annual IEEE International Reliability Physics Symposium, 2001, pp. 67-72.

Diorio, C. et al., "A High-Resolution Non-Volatile Analog Memory Cell", IEEE International Symposium on Circuits and Systems, vol. 3, 1995, pp. 2233-2236.

Diorio, C. et al., "A Floating-Gate Mos Learning Array with Locally Computed Weight Updates" IEEE Transactions on Electron Devices, vol. 44, No. 12, Dec. 1997, pp. 1-10.

Diorio, C., "A p-Channel MOS Synapse Transistor with Self-Convergent Memory Writes", IEEE Transaction On Electron Devices, vol. 47, No. 2, Feb. 2000, pp. 464-472.

Herdt, C. et al., "Analysis, Measurement, and Simulation of Dynamic Write Inhibit in an nvSRAM Cell", IEEE Transactions on Electron Devices, vol. 39, No. 5, May 1992, pp. 1191-1196.

Raszka, J. et al., "Embedded Flash Memory for Security Applications in a 0.13 µm CMOS Logic Process", 2004 IEEE International Solid-State Circuits Conference, ISSCC, Session 2, Non-Volatile Memory, 2.4, pp. 46-47, Feb. 2004.

Shi, Y. et al., "Polarity Dependent Gate Tunneling Currents in Dual-Gate CMOSFET's", IEEE Transactions on Electron Devices, vol. 45, No. 11, Nov. 1998, pp. 2355-2360.

Usuki, T. et al., "Direct Tunneling Memory: Trade-off Between Nonvolatility and High-Endurance with Low Voltage Operations", Nonvolatile Semiconductor Workshop Symposium, Aug. 12, 2001, pp. 80-81.

Vittoz, E., "Dynamic Analog Techniques", Design of Analog-Digital Vlsi Circuits for Telecommunications and Signal Processing, Second Edition, Chapter 4, 1994, pp. 97-124.

Invitation to Pay Additional Fees for Application No. PCT/US03/31792, date of mailing Apr. 2, 2004.

Invitation to Pay Additional Fees for Application No. PCT/US2005/015606, date of mailing Nov. 18, 2005.

International Search Report and Written Opinion for International Application No. PCT/US20051015606, date of mailing Feb. 24, 2006.

* cited by examiner

REDUNDANT NON-VOLATILE MEMORY CELL

RELATED APPLICATIONS

The present patent application may be found related to U.S. Utility applications Ser. No. 10/437,262, filed on May 12, 2003 (IMPJ-0042), Ser. No. 11/084,214 filed on Mar. 17, 2005 (IMPJ-0115), Ser. No. 11/084,213 filed on Mar. 17, 2005 (IMPJ-0117), U.S. Provisional Application Ser. No. 60/667,435, filed on Mar. 31, 2005 (IMPJ-0124P), U.S. Utility application Ser. No. 10/839,985, filed on May 5, 2004 (IMPJ-0057), and U.S. Utility application Ser. No. 12/020,522, filed on Jan. 26, 2008 (IMPJ-0311). All Applications are incorporated herein by reference.

FIELD OF THE INVENTION

The present invention generally relates to non-volatile memory (NVM). More particularly, the present invention is related to NVMs that may be arranged in a redundant configuration for improved reliability.

BACKGROUND

Many electronic system applications require non-volatile memory (NVM) to provide a variety of functions. Example applications for NVM include storing: security settings, serial numbers, RFID (radio frequency identification) data, system configurations, calibration settings, trim settings, parameters, computer instructions (e.g., firmware), as well as others. The reprogramming of an NVM is very useful in the field of electronic tags such as RFID tags. Information that is stored in an NVM of an RFID tag can be remotely sensed for various system purposes such as electronic inventory control, electronic security systems, data logging applications, as well as others.

Reliability of NVM devices is important in field based applications, where failures are prone to occur as a result of built-in defect in materials, misuse, environmental abuse, or some other mechanically, electrically, or electro-mechanically induced failure may occur. There are several methods that can be used to increase the reliability in the NVM including error correction code (ECC) methods and various redundant NVM architectures, which have been evaluated in pursuit of the instant disclosure.

Error correction code (ECC) methodologies use software and/or hardware based error checking algorithms to evaluate data that is stored in the NVM to determine if the data is error free. Example ECC methods include odd/even parity checking, odd/even checksum, cyclic redundancy codes (CRC), as well as others. A problem that has been reviewed in consideration of the present disclosure is that additional memory bits and additional circuits may be necessary in the NVM to allow for ECCs. The number of additional memory bits depends on the configuration of the memory, i.e., word size. The additional circuitry is necessary to decode the information stored in the NVM. ECC topologies can usually only correct for single bit failures. Higher order ECC topologies can be used to correct for multiple bit failures but also need additional area and additional circuit complexity.

An example redundant NVM architecture that has been evaluated in consideration of the present disclosure is to use additional data bits (e.g., 2 bits) as a backup for each single bit of data. Although this is a fully redundant solution, the resulting NVM is very inefficient in the use of area (e.g., 200% greater than the original area for 2 additional data bits) in implementing a solution.

BRIEF DESCRIPTION OF THE DRAWINGS

Non-limiting and non-exhaustive embodiments are described with reference to the following drawings.

DETAILED DESCRIPTION OF THE PREFERRED EMBODIMENT

Figure 1A:
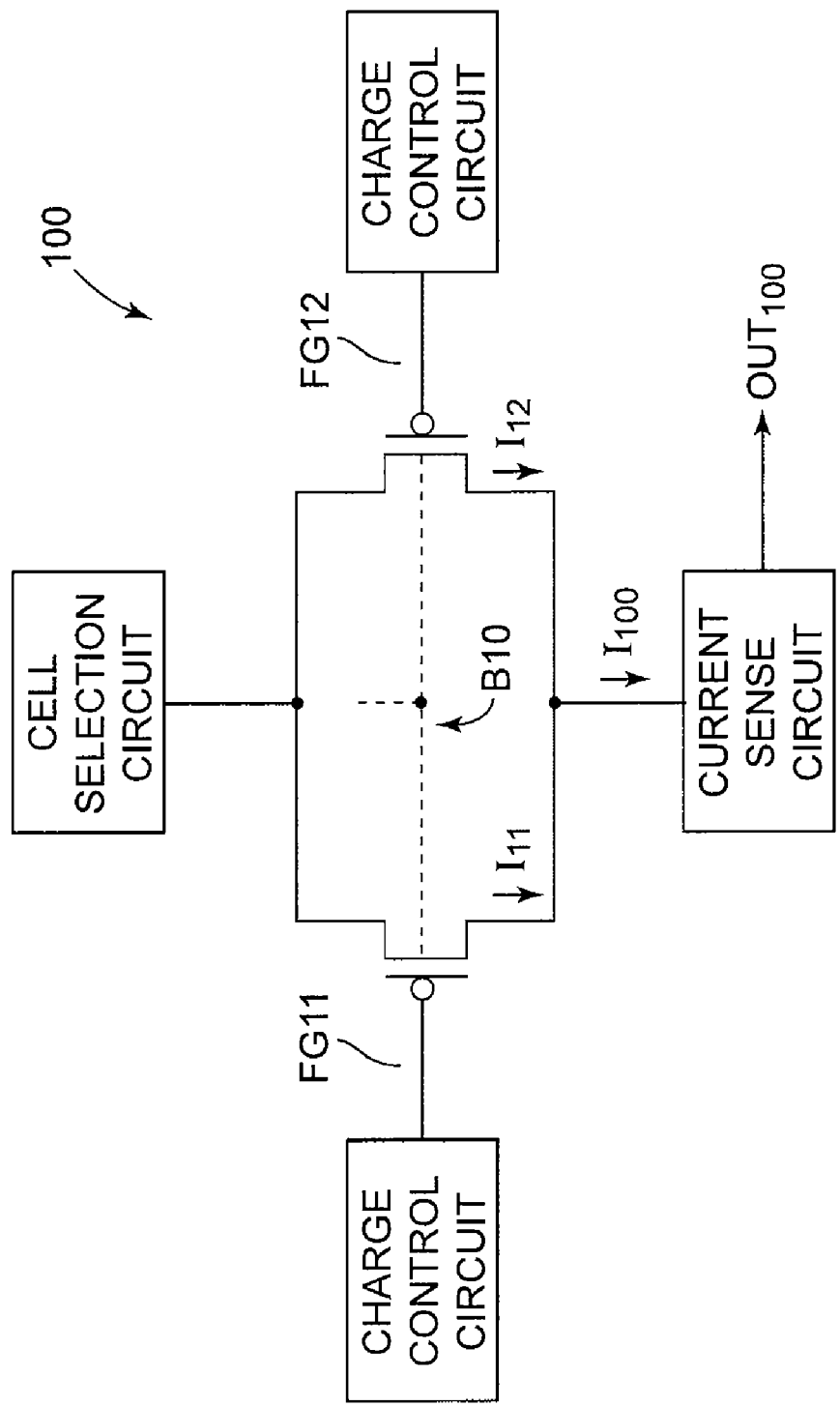
FIG. 1A is a schematic diagram of a non-volatile memory (NVM) circuit that employs redundant p-type transistors in a parallel configuration.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, two or more floating gate devices are arranged in a redundant configuration in a non-volatile memory (NVM) such that stress induced leakage current (SILC) or other failures do not result in a complete loss of memory storage. The redundant NVM may be arranged as a series configuration, a parallel configuration, a single-ended device, a differential device, a simple logic circuit function, a complex logic circuit function, and/or as part of an RFID tag system.

The present disclosure applies generally to redundant NVM architectures, and has particular application in both low-density and high-density NVM. An example redundant NVM might be found in an embedded CMOS application. Such embedded CMOS applications include (but are not limited to) storing: serial numbers (i.e. chip tags), configuration information in ASICs (application specific integrated circuits), product, package and/or asset data in radio frequency identification (RFID) integrated circuits, code or data in embedded processors (e.g., microprocessors, microcontrollers, etc), analog trim information, digital trim information, FPGA configuration information, and a host of other applications as will now be apparent to those skilled in the art.

NVM devices store information by changing the physical attributes of a transistor or other circuit element in the NVM. In the case of floating-gate memories (e.g. Flash or EEPROM), a quantity of electrons stored on an electrically isolated (floating) gate of a silicon MOSFET (metal oxide semiconductor field effect transistor) is changed to store information. All NVM devices wear out, meaning that after a certain number of write/erase cycles the NVM memory will no longer meet its retention requirement (e.g., 10-yr retention). In the case of floating-gate memories, wear out may occur because the process of moving electrons through the insulating oxide surrounding an electrically isolated gate eventually damages the insulating oxide.

Information is stored in a floating-gate type NVM by changing the amount of electronics that are stored on the floating gate. Adding or removing electrons from the floating gate (e.g., a floating gate in a MOSFET device) results in a change in the threshold voltage associated with the device. To read data from the NVM memory cell, the channel current (or currents in the case of the differential NVM cell) associated with the device is measured. Depending on the quantity of electrons present on the floating gate, the MOSFET device will either be biased active (e.g., "on") or inactive (e.g., "off"). The measured channel current is interpreted as either a logical "1" or a logical "0" based on the relative on/off state of the floating-gate transistors.

The operation of various redundant NVM cells will be described in further detail by way of examples found below. The described redundant NVM architecture may be applied to single-ended NVM cells, differential NVM cells, and configurable NVM cells that may be configured for either single ended or differential operation. Moreover, the redundant NVM architecture concepts may be applied to logic cell architectures such as, for example, NAND arrays, NOR arrays, AND arrays, OR arrays, and INVERTER cells, as well as embedded NVM devices such as for RFID tags.

In one example redundant NVM cell configuration, an "on" state associated with an original floating gate device may leak such that the original floating gate device changes from an "on" state to an "off" state, For this example, a redundant floating gate device is effectively provided in parallel with the original floating gate device such that the redundant circuit as a whole appears as a device that is maintained in the "on" state.

In another example redundant NVM cell configuration, an "off" state associated with an original floating gate device may leak such that the original floating gate device changes from an "off" state to an "on" state, For this example, a redundant floating gate device may be effectively provided in series with the original floating gate device such that the redundant circuit as a whole appears as a device that is maintained in the "off" state.

FIG. 1A is a schematic diagram of a non-volatile memory (NVM) circuit (100) that employs redundant p-type transistors in a parallel configuration. The example redundant NVM circuit includes a cell selection circuit, a first charge control circuit, a second charge control circuit, two p-type floating gate MOSFET devices, and a current sense circuit. The two p-type floating gate MOSFET devices are coupled together in parallel, where each has a separate floating gate (FG11, FG12) that may be separately controlled by a respective one of the charge control circuits. The cell selection circuit is arranged to activate a particular NVM cell for operation (e.g., program or readout), and the current sense circuit is arranged to sense the operating currents (e.g., I11, I12) of the NVM cell during a readout operation to provide signal OUT100.

Figure 1B:
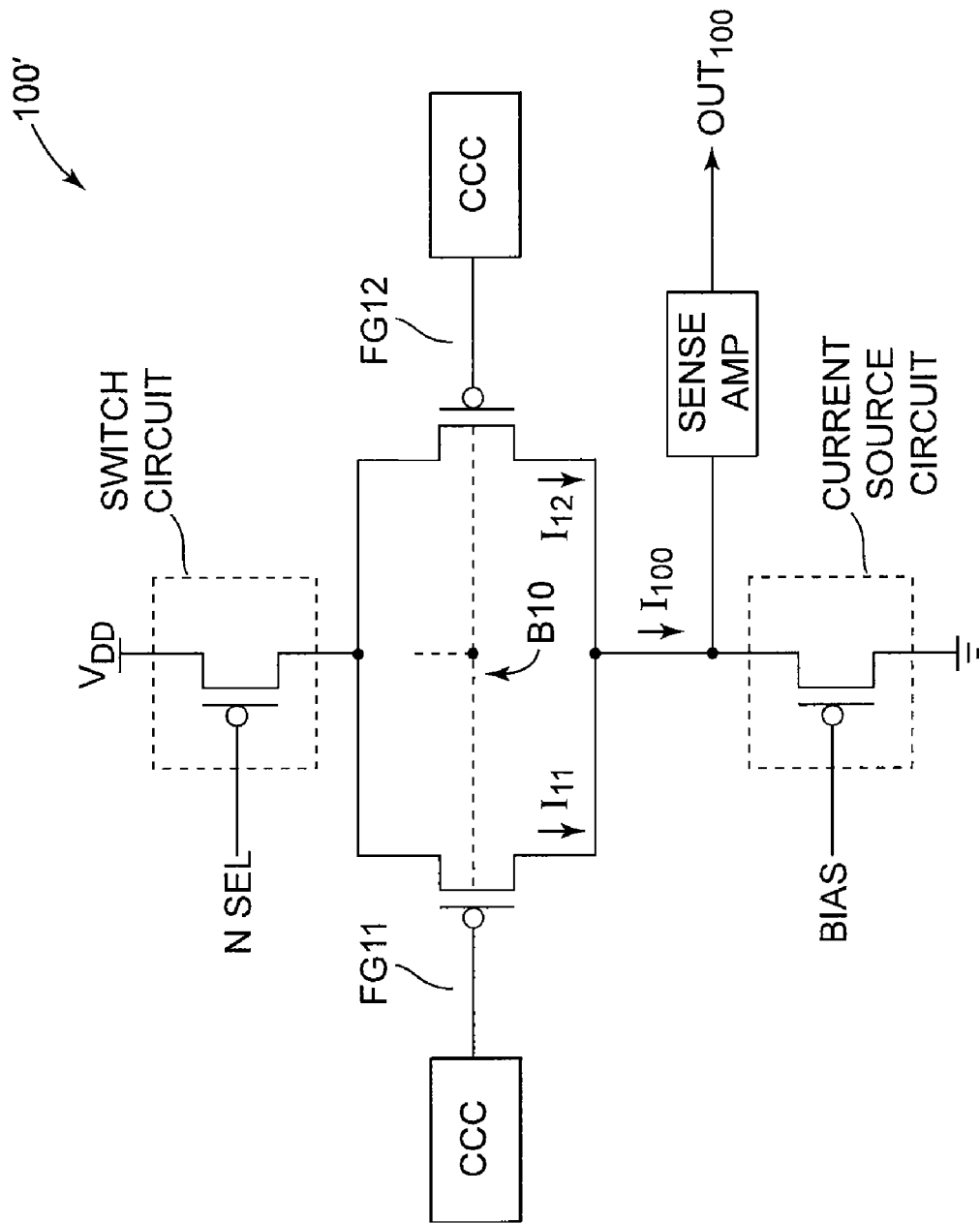
FIG. 1B is another schematic diagram of a NVM circuit that employs redundant p-type transistors in a parallel configuration.

FIG. 1B is another schematic diagram of a NVM circuit (100') that employs redundant p-type transistors in a parallel configuration. FIG. 1B is substantially similar to FIG. 1A in general operation in that charge control circuits are provided to the floating gates (FG11, FG12) of the p-type MOSFET devices.

The cell selection circuit illustrated in FIG. 1B is a switch circuit that includes a p-type MOSFET transistor that is series coupled between a power terminal (e.g., VDD) and the source terminals of the parallel coupled p-type MOSFET devices. The switch circuit is responsive to a control signal (NSEL) such that the source terminals of the parallel coupled p-type floating gate MOSFET devices are: coupled to the power terminal when the switch circuit is operated in a closed circuit condition and isolated from the power terminal when the switch circuit is operated in an open circuit condition.

An example current sense circuit is illustrated in FIG. 1B by a sense amplifier circuit and a current source circuit. The current source circuit is coupled between the drain terminals of the parallel coupled p-type floating gate MOSFET devices and another power terminal (e.g., VSS or GND). The current source circuit, which is illustrated as an n-type MOSFET transistor, is biased by a bias signal to draw current I100 from the drain terminals of the p-type floating gate MOSFET devices. When either of the p-type floating gate MOSFET devices is active, current I100 is non-zero and the sense amplifier appropriately asserts OUT100 to a first condition (e.g., logic "1"). When both of the p-type floating gate MOSFET devices are inactive, current I100 is zero and the current source pulls the signal associated with the drain terminals to the other power terminal voltage (e.g., VSS or GND), and the sense amplifier asserts OUT100 to a second condition (e.g., logic "0").

Figure 1C:
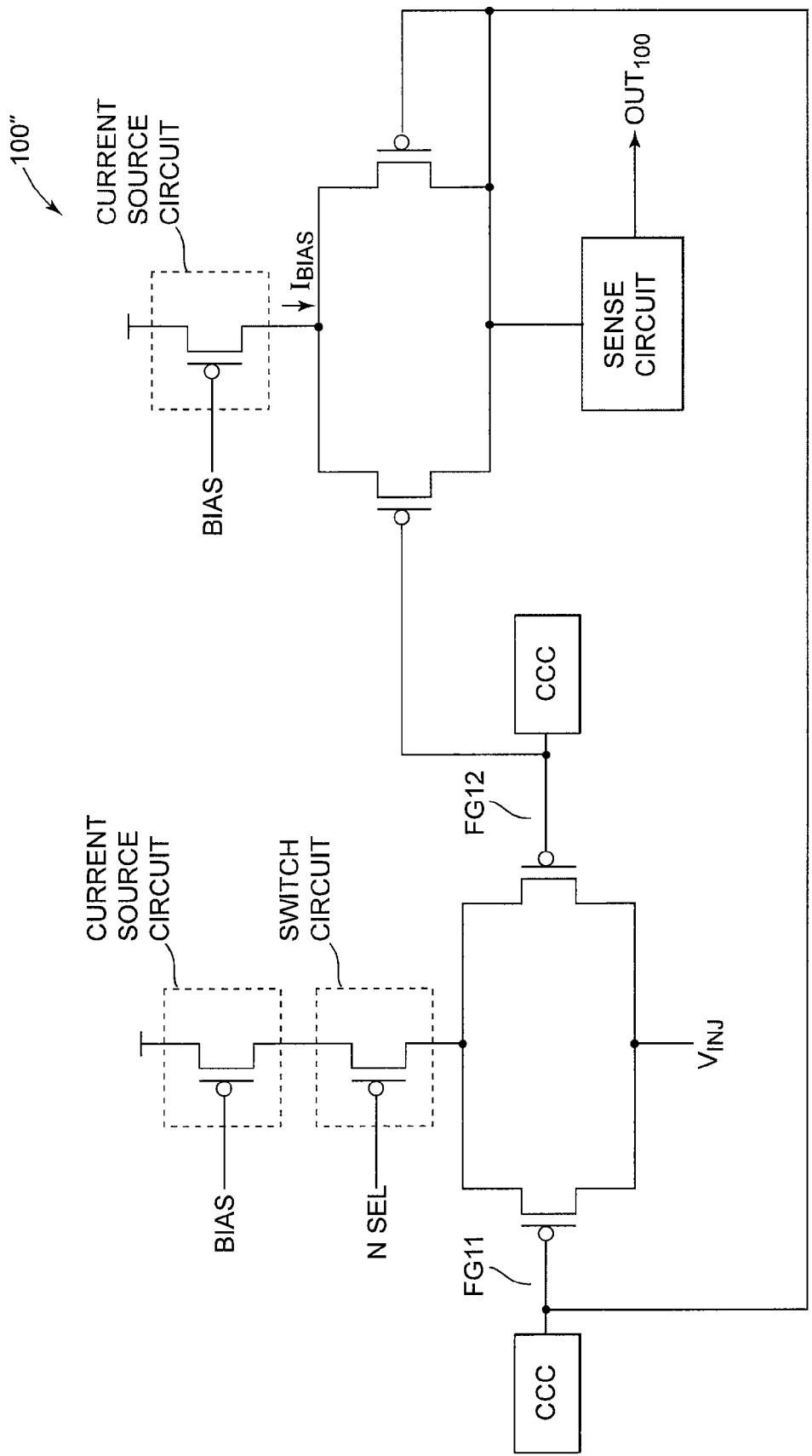
FIG. 1C is yet another schematic diagram of an NVM circuit that employs redundant p-type transistors in a parallel configuration.

FIG. 1C is yet another schematic diagram of an NVM circuit (100") that employs redundant p-type transistors in a parallel configuration. NVM circuit 100" includes two pairs of p-type floating gate MOSFET devices, a pair of current source circuits, a switch circuit, a pair of charge control circuits (CCC), and a sense circuit. The first pair of p-type floating gate MOSFET devices are coupled together in parallel, where each has a separate floating gate (FG11, FG12) that may be separately controlled by a respective one of the charge control circuits (CCC). The drain terminals of the first pair of p-type floating gate MOSFET devices are coupled to an injection voltage level (VINJ). The source terminals of the first pair of p-type floating gate MOSFET devices are selectively coupled to a power supply level (e.g., VDD) via the series coupled switch circuit and current source circuit. The second pair of p-type floating gate MOSFET devices are coupled together in parallel, where each has a separate floating gate that is separately controlled by a respective one of the charge control circuits (CCC). The drain terminals of the second pair of p-type floating gate MOSFET devices are coupled to the sense circuit. The source terminals of the second pair of p-type floating gate MOSFET devices are selectively coupled to a power supply level (e.g., VDD) via the second current source circuit.

Failures for floating gate NVM cells are dominated by stress induced leakage current (SILC), which is due to random defects. When the density of defects is small, there is no correlation between the presence/absence of SILC related leakage on adjacent NVM cells. The NVM memory cell has two states. In one state, the read transistor is normally conductive ("on" or "active") and the other state (or complementary state) the read transistor is normally non-conductive or only weakly conducting ("off" or "inactive").

Each p-type floating gate MOSFET device is operated in one of two states "active" and "inactive" (or "on" and "off") based on the quantity of electrons that are stored on their respective floating gate. For this example, the "on" states of the p-type floating gate MOSFET devices have more electrons on the floating gate than the "off" states. As a consequence, the "on" state may be susceptible to leakage mechanisms such as stress induced leakage current (SILC), and could lose its excess of electrons and transition from the "on" state to the "off" state. Since the two p-type MOSFET devices are effectively in parallel with one another, the failure of one p-type MOSFET is mitigated by the operation of the other p-type MOSFET. By adding a second, "redundant", floating gate (FG1) and readout transistor to the cell, the current path from the cell selection circuitry to the current sensing circuitry will not be broken off by the leakage. The two floating gate p-type MOSFET devices can optionally be arranged in a shared n-well region as illustrated by common bulk connection (see e.g., B10, B20, etc.) such that the area consumed by the NVM cell is dramatically reduced.

Figure 2:
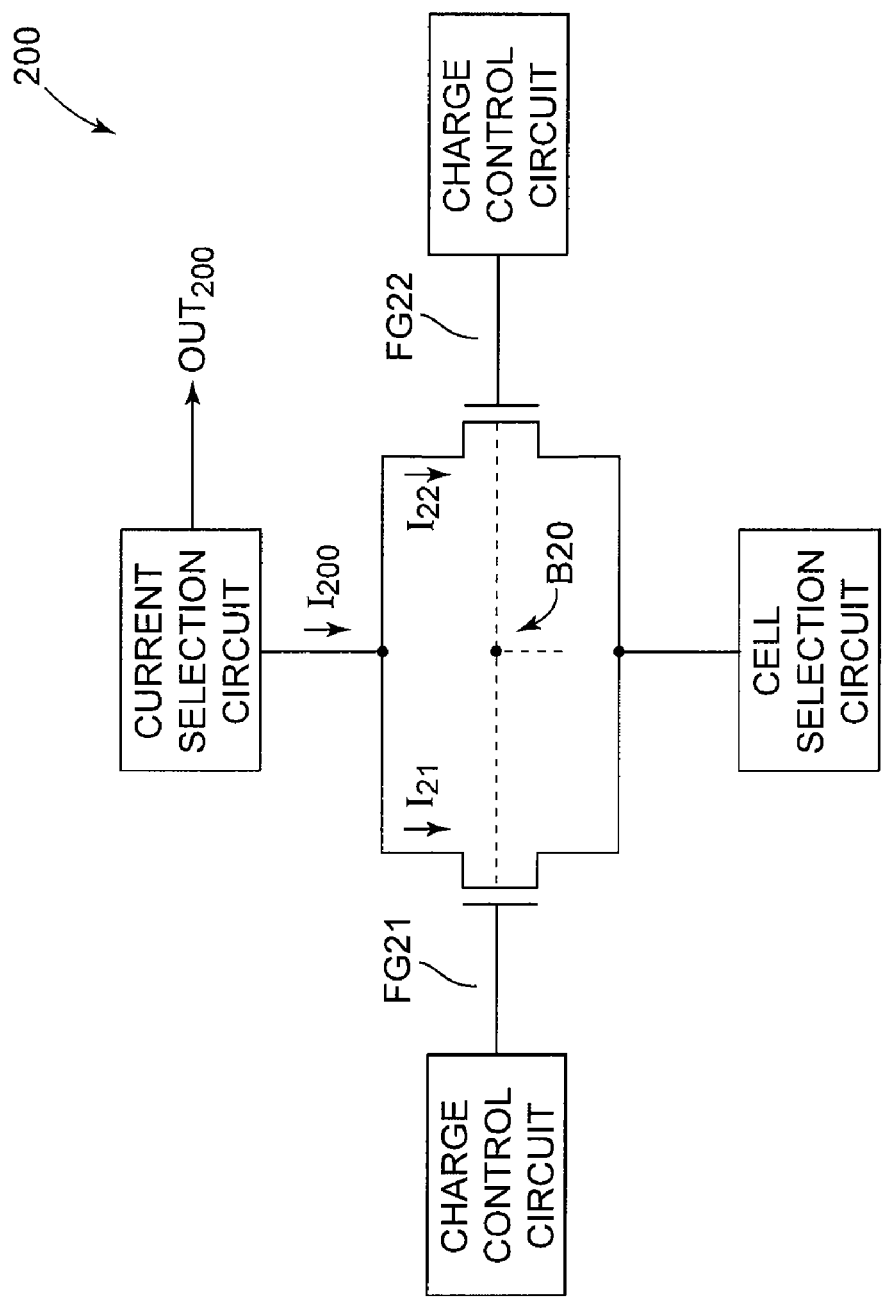
FIG. 2 is a schematic diagram of a NVM circuit that employs redundant n-type transistors in a parallel configuration.

FIG. 2 is a schematic diagram of a NVM circuit (200) that employs redundant n-type transistors in a parallel configuration. NVM circuit 200 is substantially similar to that described with respect to NVM circuit 100 of FIG. 1A, except that the floating gate devices are n-type floating gate MOSFET devices.

Figure 3:
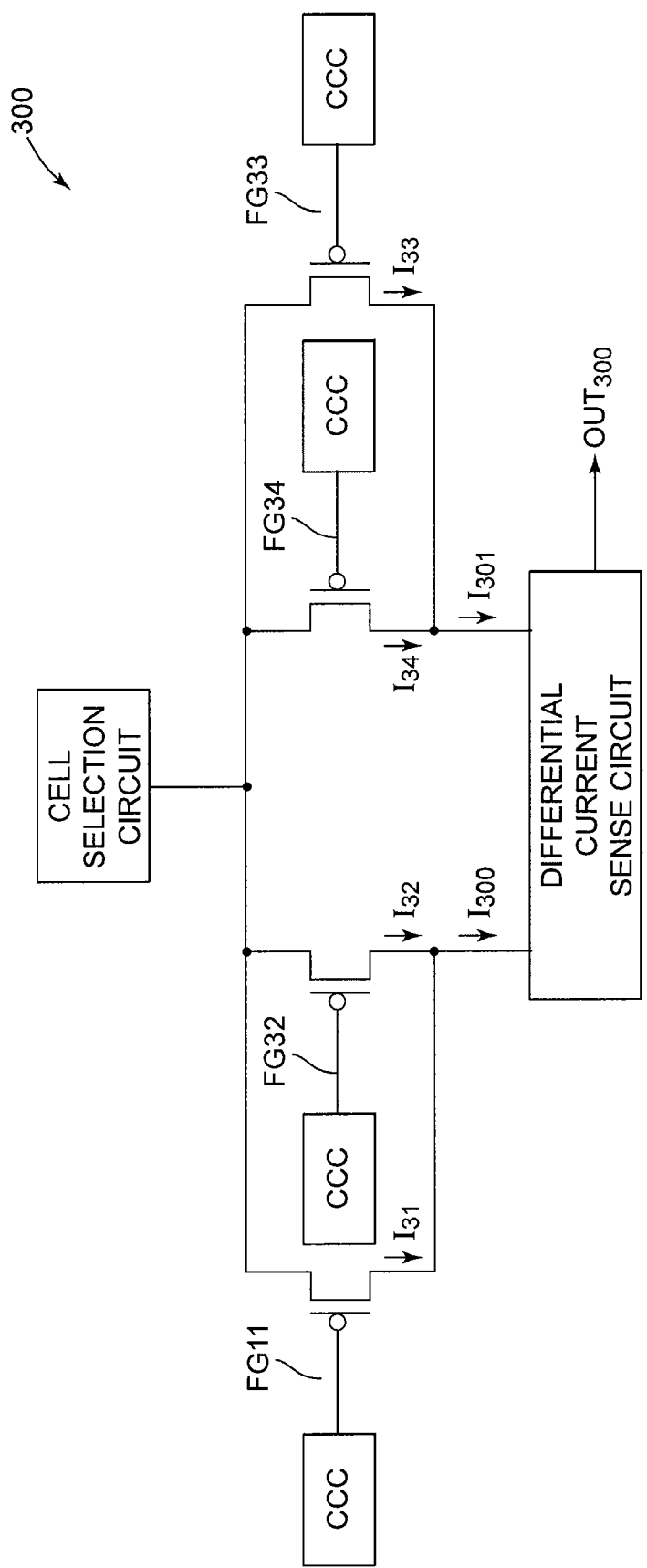
FIG. 3 is a schematic diagram of a differential NVM circuit that employs redundant p-type transistors in a parallel configuration.

FIG. 3 is a schematic diagram of a differential NVM circuit (300) that employs redundant p-type transistors in a parallel configuration. NVM circuit 300 includes a cell selection circuit, a first charge control circuit, a second charge control circuit, a third charge control circuit, a fourth charge control circuit, four p-type floating gate MOSFET devices, and a differential current sense circuit. Two p-type floating gate MOSFET devices are coupled together in parallel, where each has a separate floating gate (FG31, FG32) that may be separately controlled by a respective one of the charge control circuits. Another two p-type floating gate MOSFET devices are coupled together in parallel, where each has a separate floating gate (FG33, FG34) that may be separately controlled by a respective one of the charge control circuits. The cell selection circuit is arranged to activate a particular NVM cell for operation (e.g., program or readout), and the differential current sense circuit is arranged to sense the operating currents (e.g., I300, I301) of the NVM cell during a readout operation to provide signal OUT300.

Figure 4:
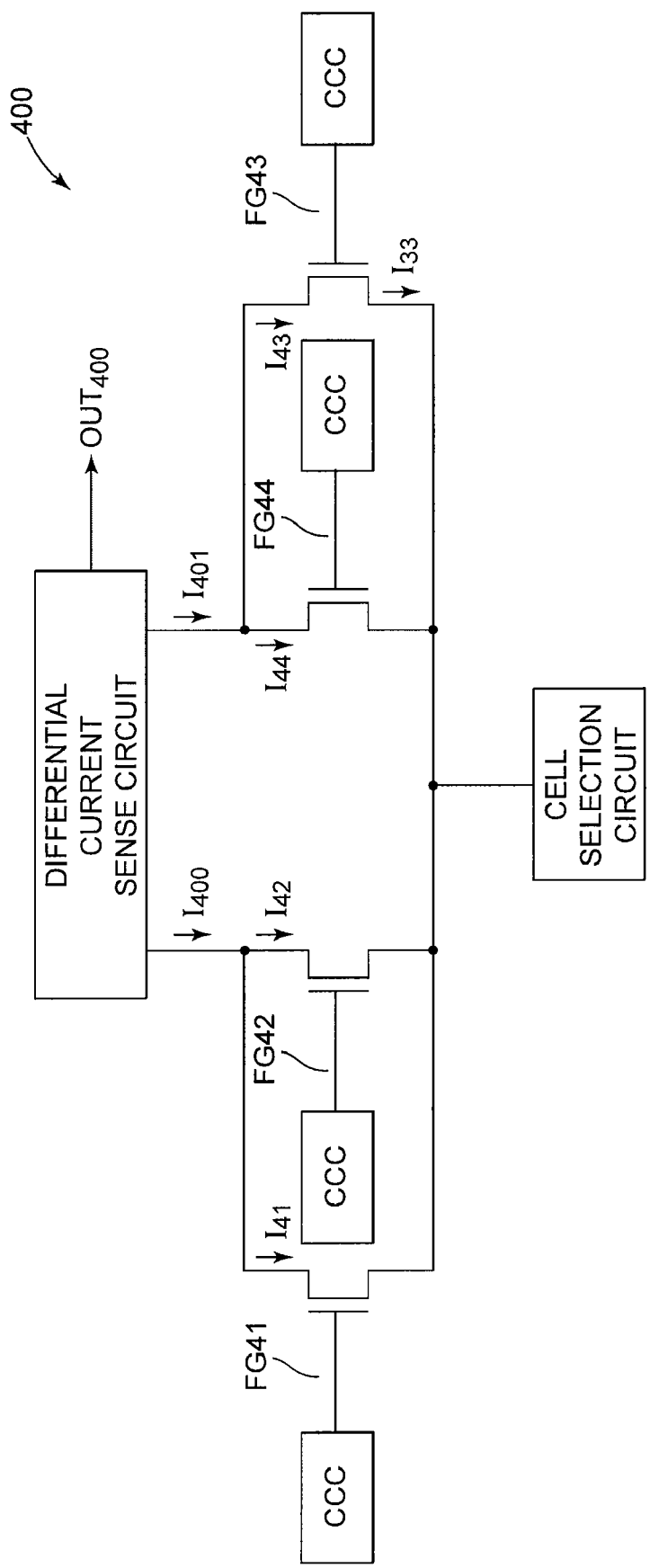
FIG. 4 is a schematic diagram of a differential NVM circuit that employs redundant n-type transistors in a parallel configuration.

FIG. 4 is a schematic diagram of a differential NVM circuit (400) that employs redundant n-type transistors in a parallel configuration. Differential NVM circuit 400 is substantially similar in operation to NVM circuit 300 from FIG. 3.

Figure 5:
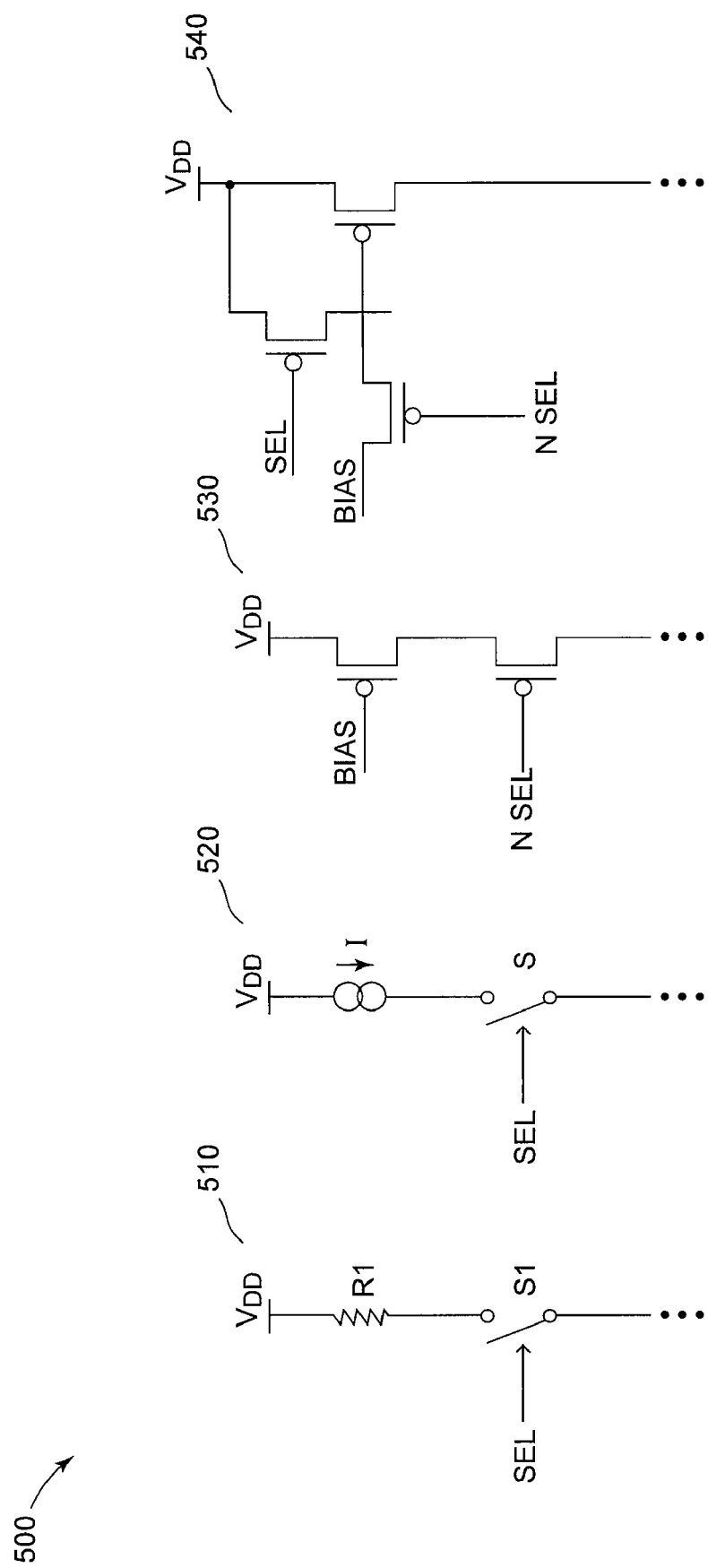
FIG. 5 is a schematic diagram of example cell selection circuits for a NVM circuit.

FIG. 5 is a schematic diagram of example cell selection circuits (500) for an NVM circuit. In one example (510), the selection circuit comprises the series combination of a resistor and a switch circuit. In another example (520), the selection circuit comprises the series combination of a current source and a switch circuit. In yet another example (530), the selection circuit comprises the series combination of a biased transistor current source and a transistor switch circuit. In still another example (540), a selectable current source is provided by a transistor that is selectively biased or disabled for operation by a set of transistor switching circuits.

Figure 6:
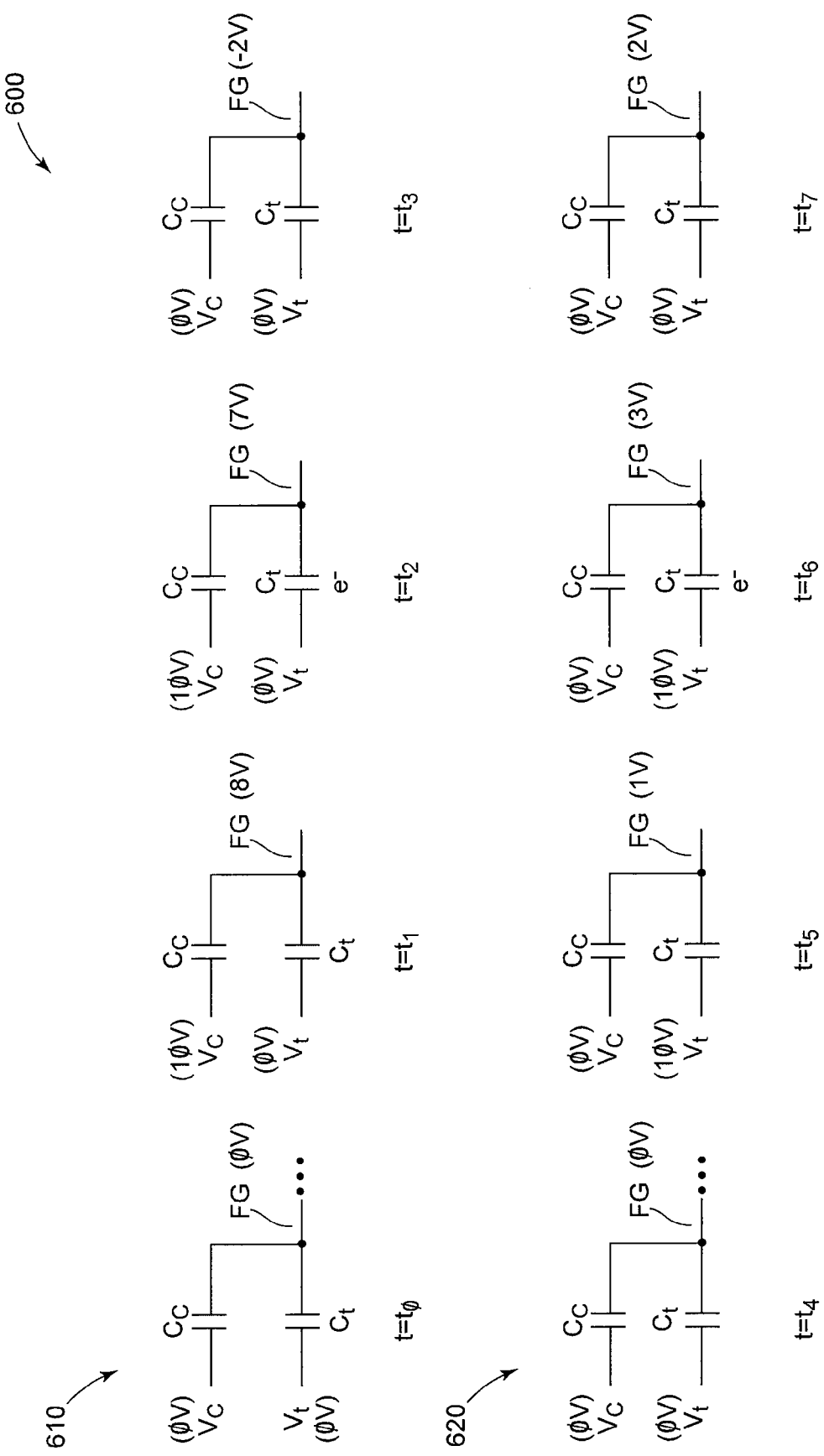
FIG. 6 is a schematic illustration of adding and removing electrons from a floating gate in a NVM circuit with a capacitive based charge control circuit.

FIG. 6 is a schematic illustration (600) of adding (610) and removing (620) electrons from a floating gate device in a NVM circuit with a capacitive based charge control circuit. The capacitor devices described herein are merely example devices that are provided to illustrate of the overall concept. However, capacitor Cc corresponds to a control transistor, while capacitor Ct corresponds to a tunneling transistor. A voltage is provided across the oxide of a floating gate device by applying a voltage (Vc) across Cc or by applying another voltage (Vt) across Ct. Capacitor Cc and Ct are not equal in value such that the floating gate voltage is more strongly coupled to the control voltage Vc than Vt.

The floating gate devices described herein can be implemented as single polysilicon based devices with an injection transistor and a tunneling transistor, where the injection transistor is also the read-out transistor. The electron removal may be accomplished by Fowler-Nordheim (FN) tunneling and electron addition is by hot electron injection. In one example, the charge injection/remove circuitry is a p-type MOSFET with its source/drain and n-well tied together to a tunneling signal (e.g., Vt)

In another embodiment, the floating gate devices may be implemented as double polysilicon based devices. In this case, the charge injection/remove circuitry and the read-out transistor may be a single double poly based p-type MOSFET.

In yet another embodiment, a one time programmable cell can be implemented where the charge injection and removal circuitry can be omitted. The readout of the p-type MOSFET an initially be erased by exposure to UV light, and subsequently programmed by hot electron injection.

In still another embodiment, the floating gate devices are single poly devices, and the charge injection and removal circuitry is composed of a control gate and a tunneling junction. The electron removal and injection for this example may be accomplished with bi-directional FN tunneling.

The procedure for adding electrons (610) in this example results in a drop of the floating gate voltage from 0V to −2V. At time t0, capacitors Cc and Ct have 0V across them and the floating gate voltage is 0V. At time t1, Vc=10V and a large electric field is provided to the oxide of the tunneling device (Ct) and at time t2 electrons begin tunneling through the oxide towards the floating gate. At time t3 the field is removed from the tunneling device and the floating gate has a voltage of −2V.

The procedure for removing electrons (620) in this example results in an increase in the floating gate voltage from 0V to 2V. At time t0, capacitors Cc and Ct have 0V across them and the floating gate voltage is 0V. At time t1, Vt=10V and a large electric field is provided to the oxide of the tunneling device (Ct) and at time t2 electrons begin tunneling through the oxide away from the floating gate. At time t3 the field is removed from the tunneling device and the floating gate has a voltage of 2V.

Figure 7:
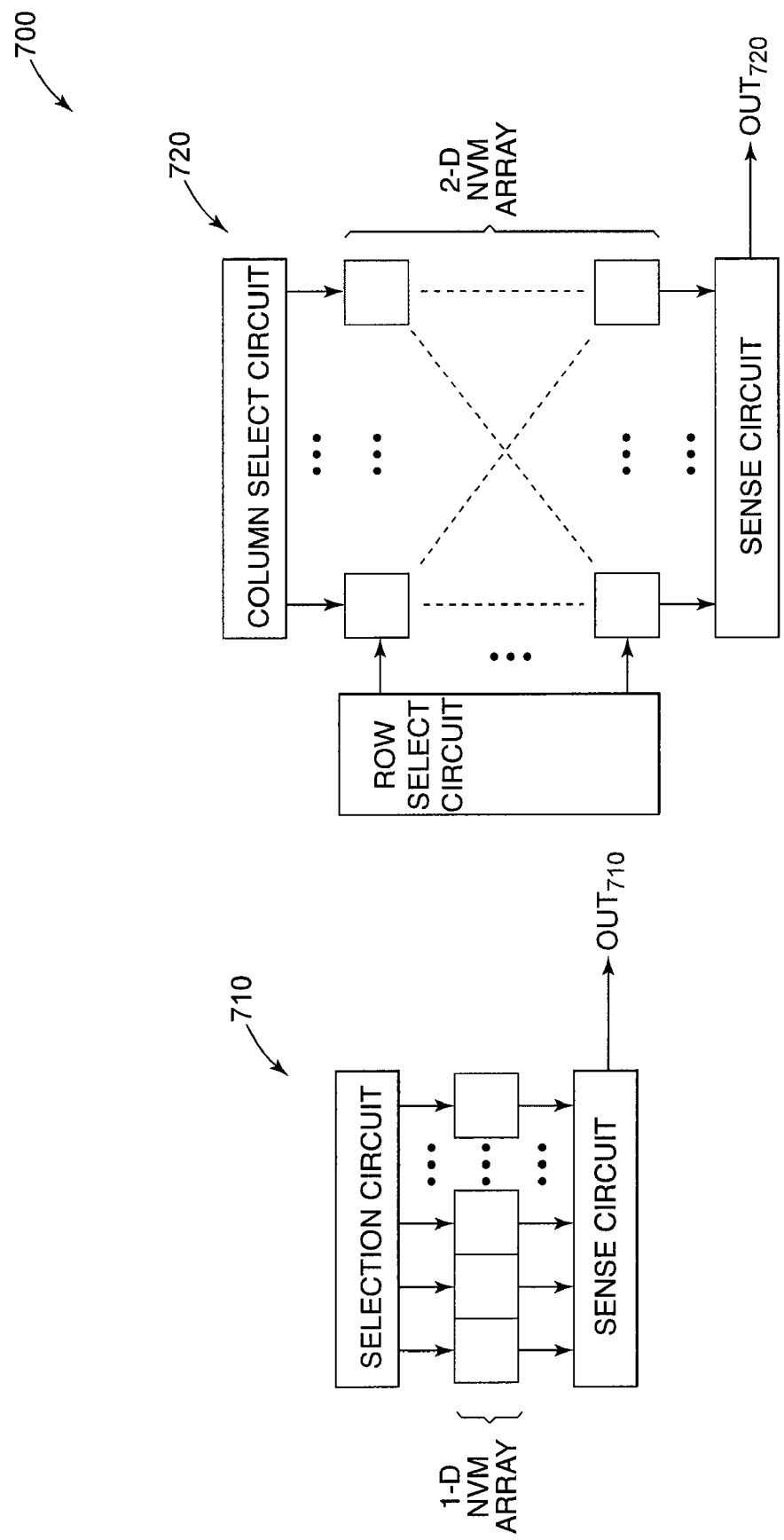
FIG. 7 is a block diagram illustrating example array structures for redundant NVM circuits.

FIG. 7 is a block diagram illustrating example array structures (700) for redundant NVM circuits. A linear array (or 1-D array) is illustrated (710) as a set of redundant NVM circuits that are all coupled to a selection circuit and a sense circuit. A matrix array (or 2-D array) is illustrated (720) as an N×M array of rows and columns, where each row is responsive to a row select circuit, and each column is response to a column select circuit, where each activated row and column has an X, Y coordinate in the matrix that is coupled to the sense circuit.

Figure 8:
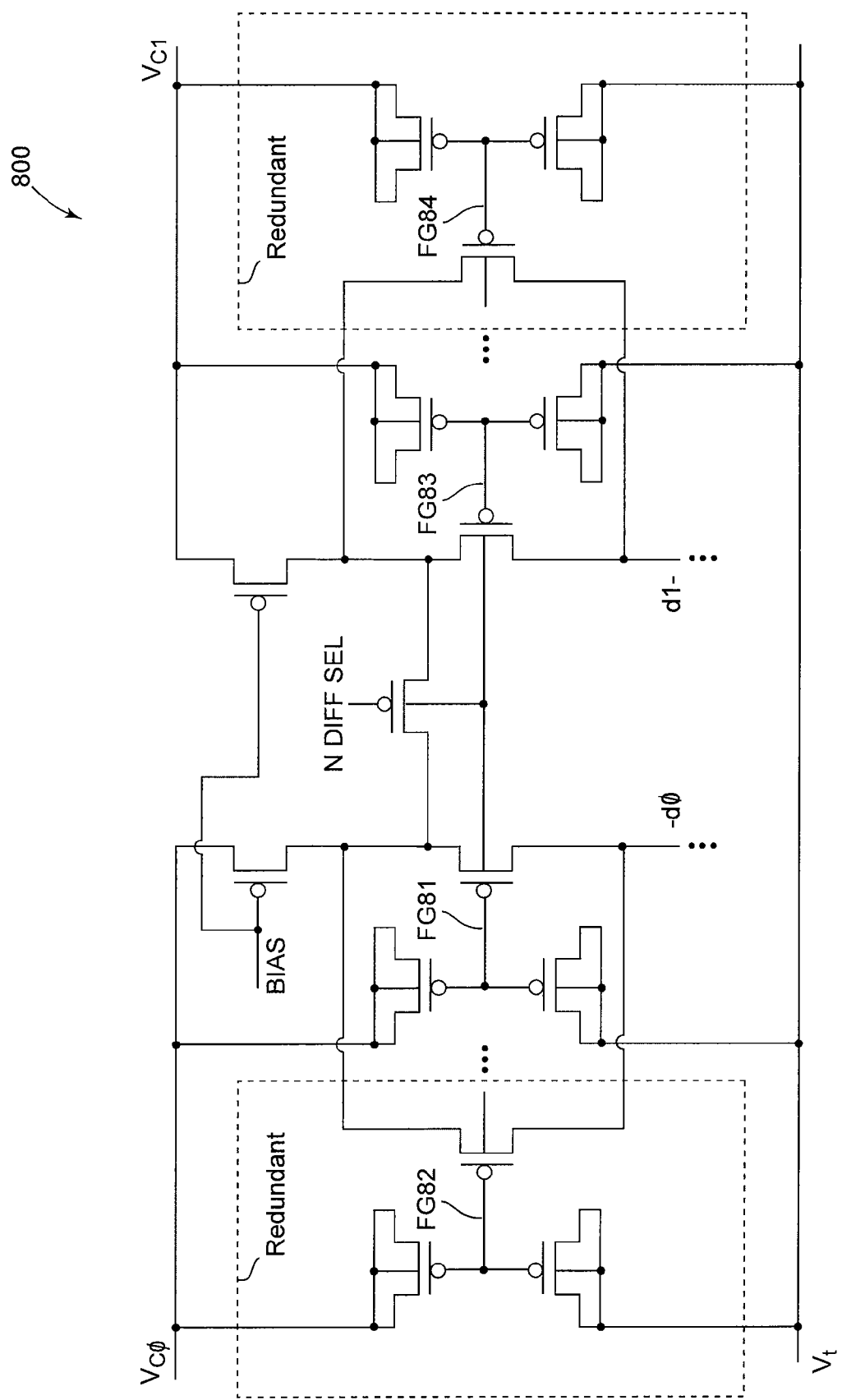
FIG. 8 is a schematic diagram illustrating a configurable differential NVM circuit that employs redundant p-type transistors in a parallel configuration.

FIG. 8 is a schematic diagram illustrating a configurable differential NVM circuit (800) that employs redundant p-type transistors in a parallel configuration. The configurable differential NVM circuit (800) includes two half-circuits that are selectively coupled together for differential operation via a switch circuit that is responsive to a differential selection signal (NDIFFSEL).

A first half circuit includes two charge injection circuits that are arranged to control charge to a respective gate terminal for two p-type floating gate transistors that share common drains and sources. Each charge injection circuits comprises a control transistor and a tunneling transistor, where the gates of the control and tunneling transistors are coupled to the floating gate terminal, and where each of the control and tunneling transistor has a common connection for their respective drain, source, and bulk connections to one of Vc0 and Vt. A current source is coupled between Vc0 and the source of the parallel coupled p-type floating gate transistors. The drain of the parallel coupled floating gate transistors are arranged to provide a first half of the output current from drain terminal d0.

A second half circuit includes two more charge injection circuits are arranged to control charge to a respective gate terminal for two more p-type floating gate transistors that share common drains and sources. Each charge injection circuits comprises a control transistor and a tunneling transistor, where the gates of the control and tunneling transistors are coupled to the floating gate terminal, and where each of the control and tunneling transistor has a common connection for their respective drain, source, and bulk connections to one of Vc1 and Vt. Another current source is coupled between Vc1 and the source of the parallel coupled p-type floating gate transistors. The drain of the parallel coupled floating gate transistors are arranged to provide a second half of the output current from drain terminal d1.

Figure 9:
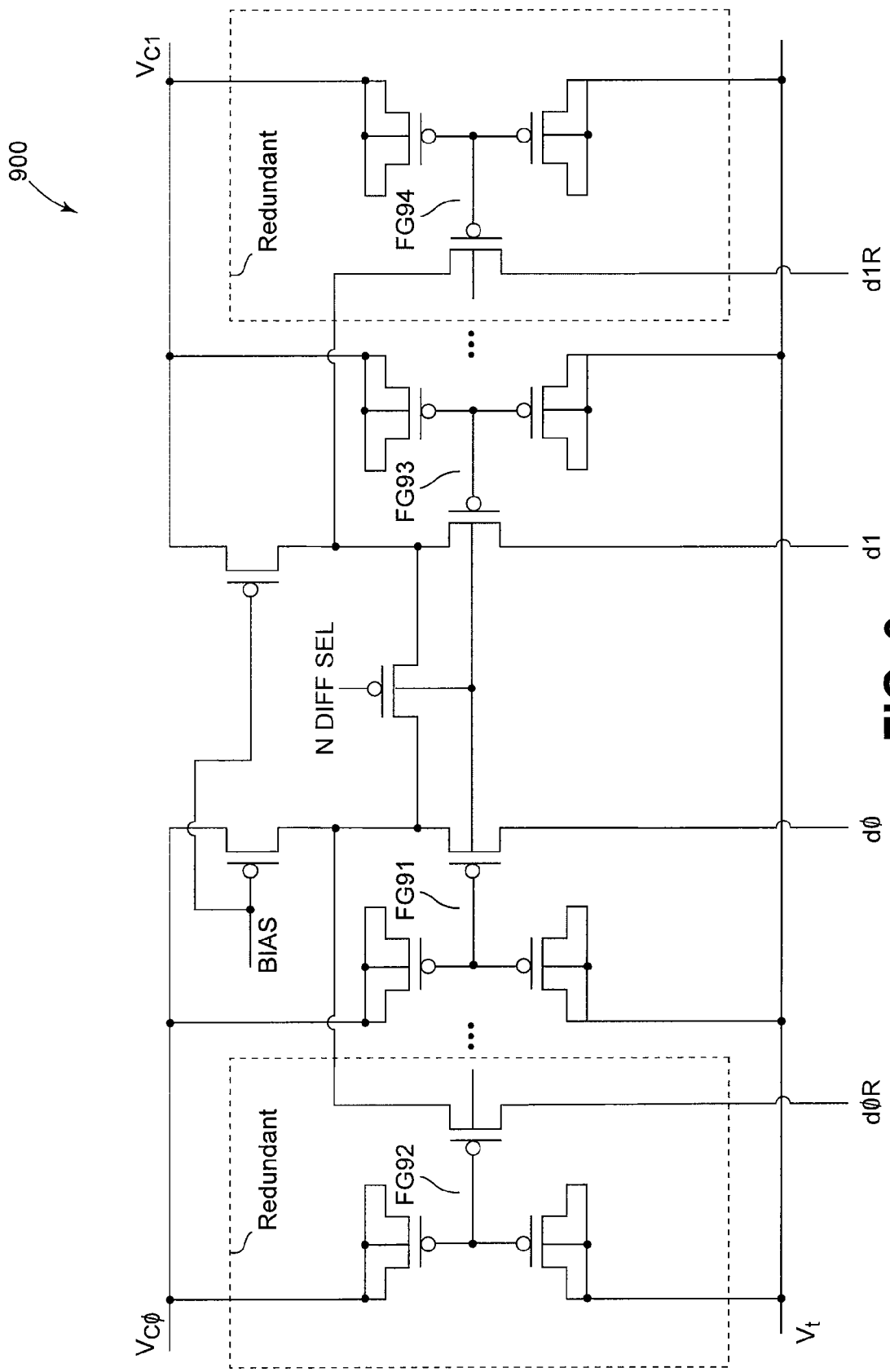
FIG. 9 is schematic diagram illustrating another configurable differential NVM circuit that employs redundant p-type transistors in a parallel configuration.

FIG. 9 is schematic diagram illustrating another configurable differential NVM circuit (900) that employs redundant p-type transistors in a parallel configuration similar to FIG. 8. However, the drain terminals of each of the p-type floating gate transistors of FIG. 9 are maintained as separate terminals (d0, d0R, d1 and d1R).

Figure 10:
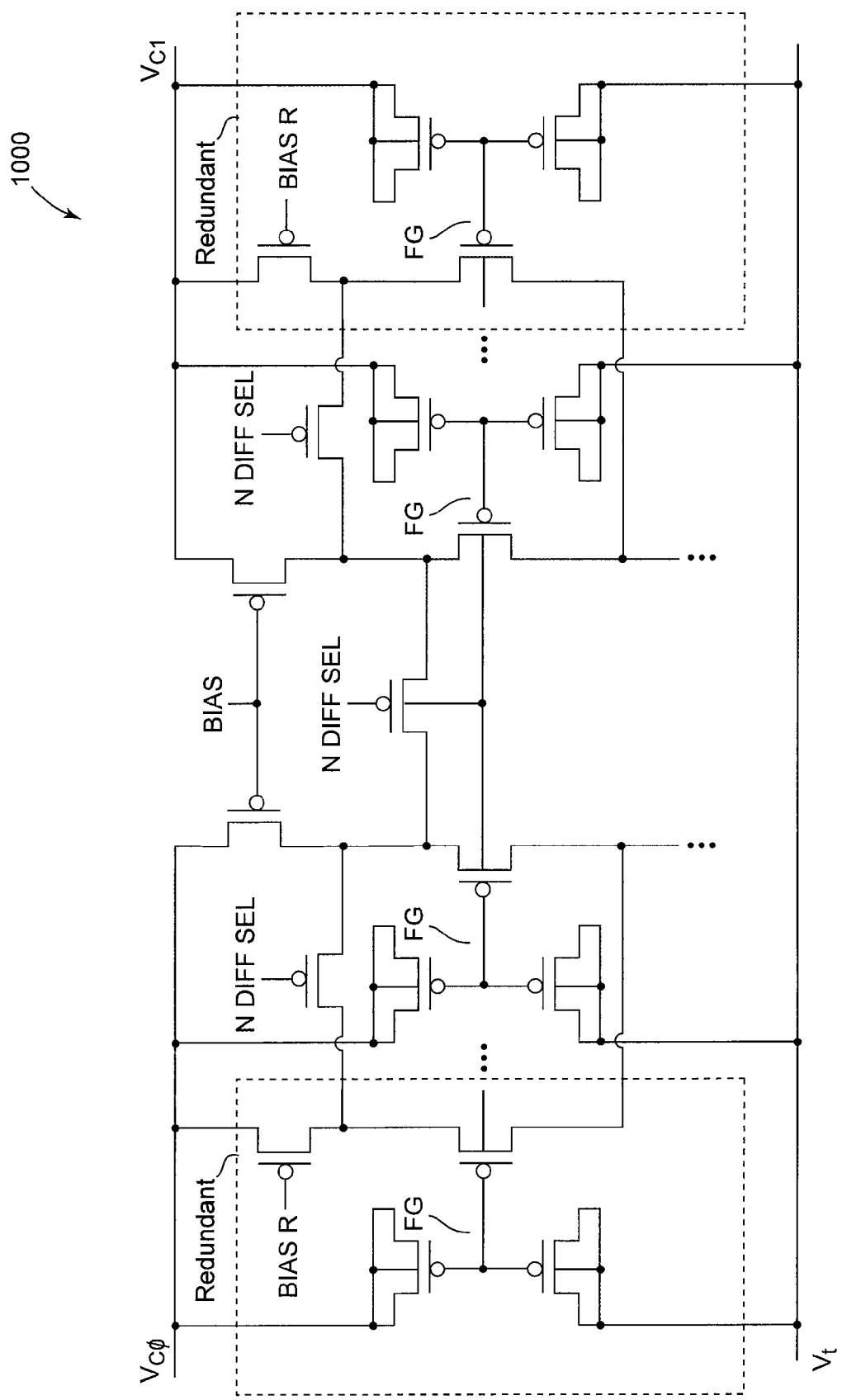
FIG. 10 is schematic diagram illustrating still another configurable differential NVM circuit that employs redundant p-type transistors in a parallel configuration.

FIG. 10 is schematic diagram illustrating another configurable differential NVM circuit (1000) that employs redundant p-type transistors in a parallel configuration similar to FIG. 8. However, the source terminals of each of the p-type floating gate transistors of FIG. 9 are maintained as separate terminals that are individually coupled to a respective control voltage (Vc0, Vc1) through a respective current source. An additional pair of switches are arranged to selectively short together the current sources and source terminals of the redundant p-type transistors that are coupled together in parallel in response to the differential selection signal (NDIFFSEL).

Figure 11:
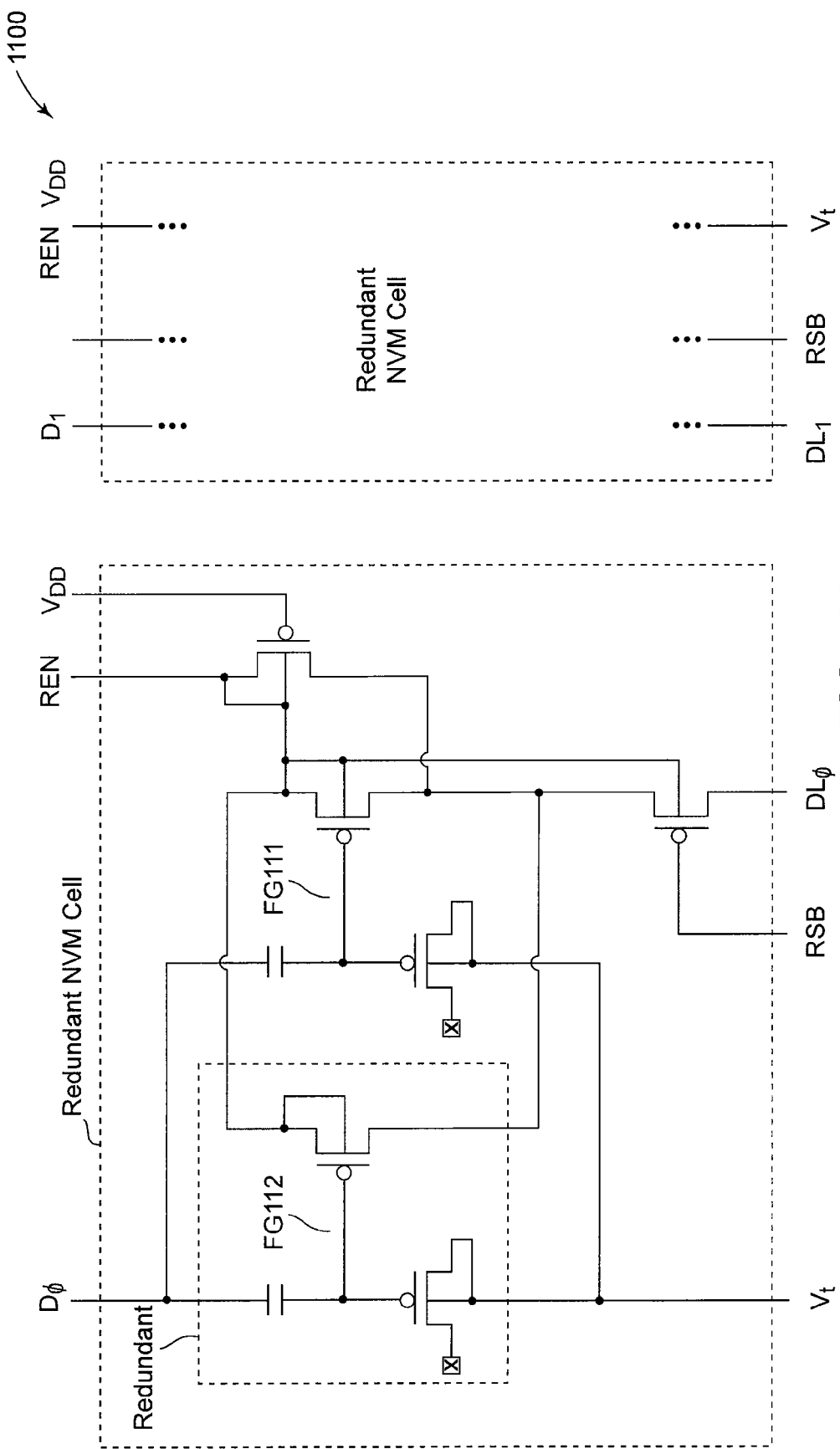
FIG. 11 is a schematic diagram illustrating yet another NVM circuit that employs redundant p-type transistors in a parallel configuration.

FIG. 11 is a schematic diagram illustrating yet another NVM circuit (1100) that employs redundant p-type transistors in a parallel configuration. A first p-type floating gate transistor includes a gate that is designated as FG111, while a second p-type floating gate transistor includes a gate that is designated as FG112. The source terminals of the p-type floating gate transistors is coupled to an enable signal (REN), while the drain terminals are coupled together to a series switching device that provides signal DL0 when signal RSB is low. Each of the p-type floating gate transistor devices has a respective charge control circuit that comprises a capacitive control device (e.g., a capacitor) and a capacitive tunneling device (e.g., a transistor).

Figure 12:
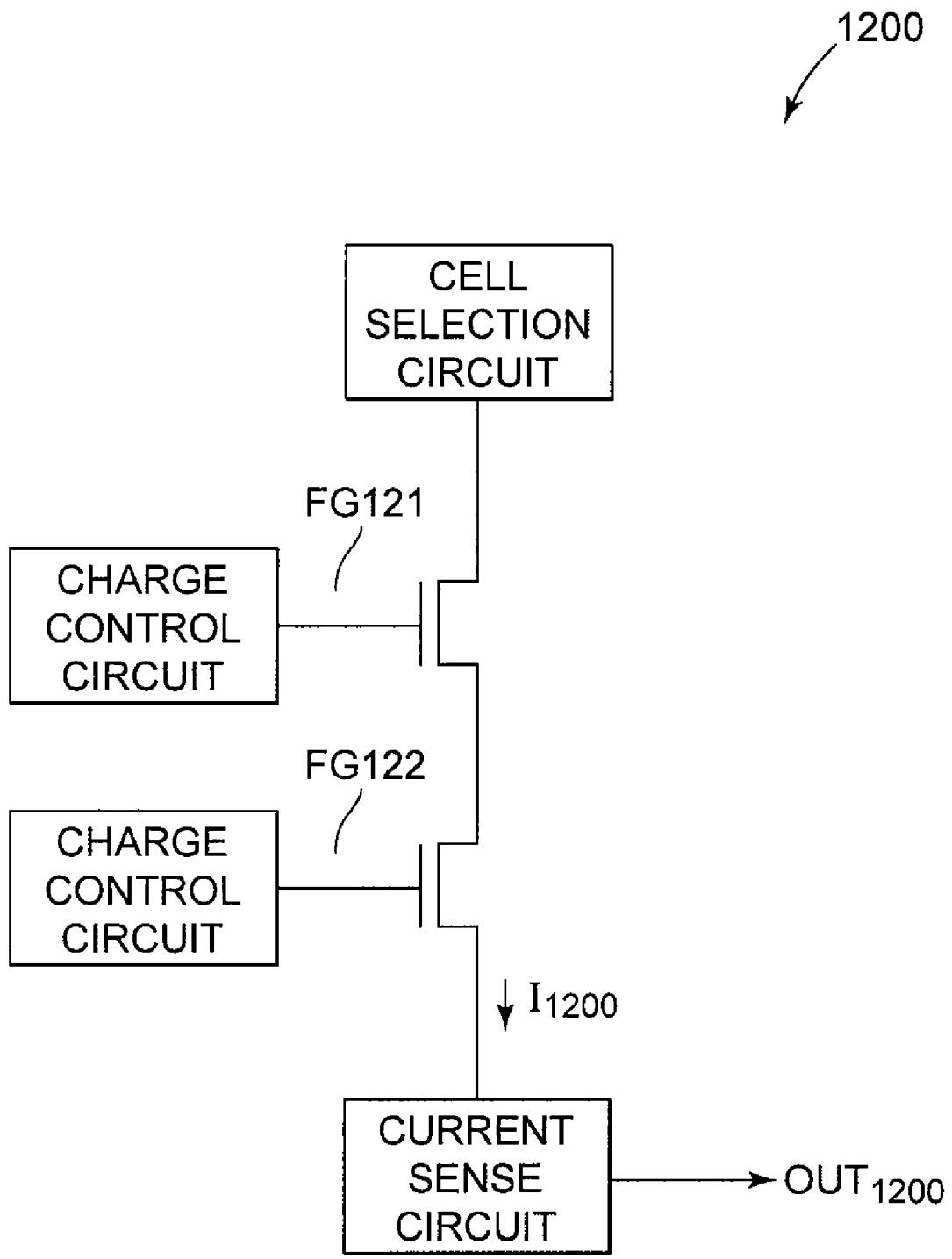
FIG. 12 is a schematic diagram illustrating another NVM circuit that employs redundant n-type transistors in a series configuration.

FIG. 12 is a schematic diagram illustrating another NVM circuit (1200) that employs redundant n-type transistors in a series configuration. The example redundant NVM circuit (1200) includes a cell selection circuit, a first charge control circuit, a second charge control circuit, two n-type floating gate MOSFET devices, and a current sense circuit. The two n-type floating gate MOSFET devices are coupled together in series, where each has a separate floating gate (FG121, FG122) that may be separately controlled by a respective one of the charge control circuits. The cell selection circuit is arranged to activate a particular NVM cell for operation (e.g., program or readout), and the current sense circuit is arranged to sense the operating currents (e.g., I1200) of the NVM cell during a readout operation to provide signal OUT1200.

The n-type floating gate MOSFET device acts as a readout transistor and has two states, "on" or "off". The "off" state has more electrons on the floating gate than the "on" states. As a consequence, the "off" state is susceptible to leakage mechanisms such as SILC, and could lose its excess of electrons and become "on". By adding a second, "redundant", floating gate and readout transistor to the cell, the current path from the cell selection circuitry to the current sensing circuitry will conduct by the leakage. The two n-type floating gate devices can optionally be arranged in a shared p-well region such that the area consumed by the NVM cell is dramatically reduced.

Figure 13:
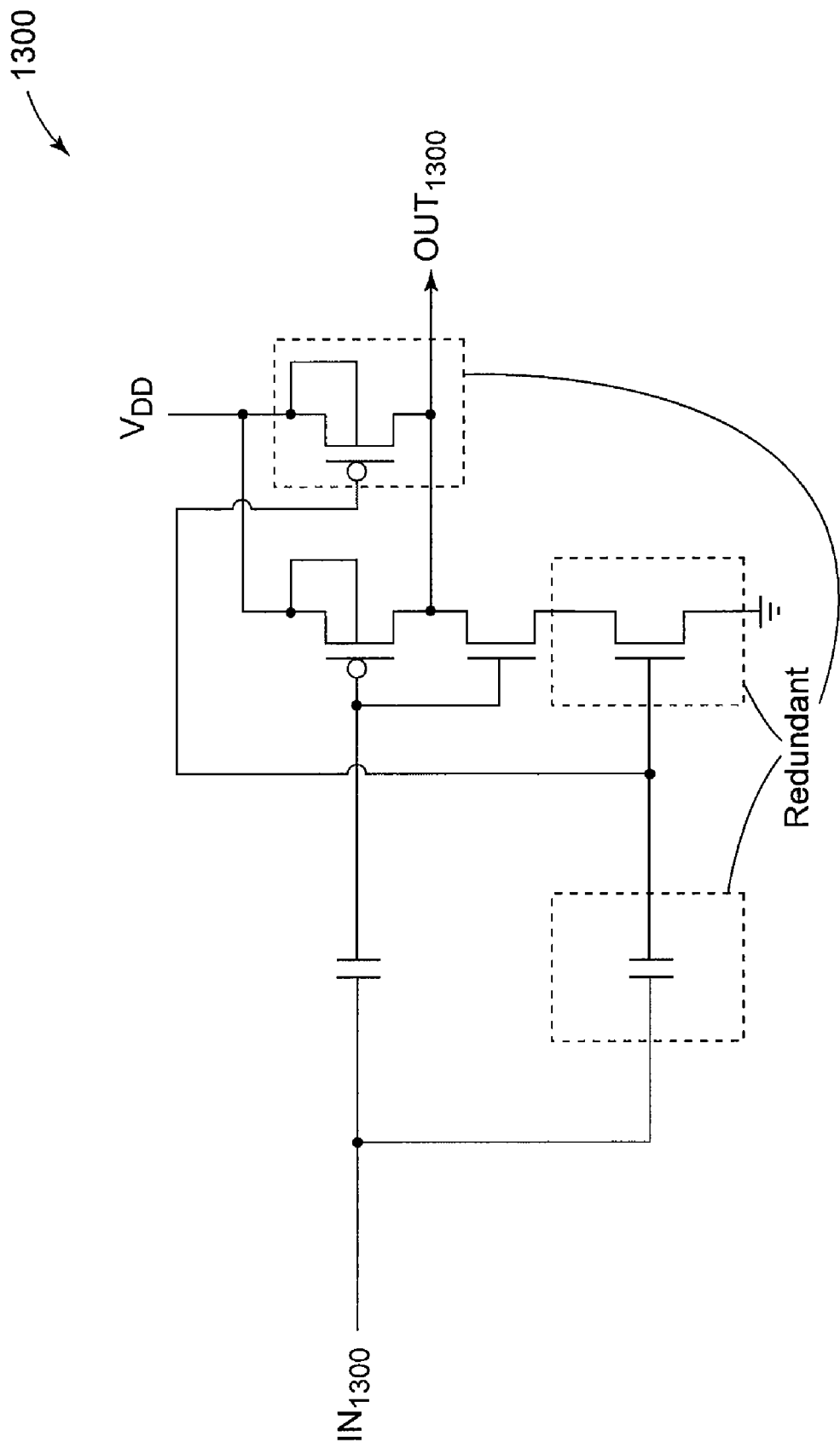
FIG. 13 is a schematic diagram illustrating an inverter circuit that includes redundant p-type transistors and redundant n-type transistors in parallel and series configurations.

FIG. 13 is a schematic diagram illustrating an inverter circuit (1300) that includes redundant p-type floating gate transistors and redundant n-type floating gate transistors in parallel and series configurations. The p-type floating gate transistors have source terminals (and optionally bulk or substrate terminals) that are coupled together to VDD, and drain terminals that are coupled together to the output terminal (OUT1300). The n-type floating gate transistors have drain and source terminals (and optionally common bulk or substrate terminals) that are coupled in series between OUT1300 and VDD. A first capacitor circuit is coupled between IN1300 and a common point for a first p-type floating gate transistor and a first n-type floating gate transistor. A second capacitor circuit is coupled between IN1300 and another common point for a second p-type floating gate transistor and a second n-type floating gate transistor.

In one alternative embodiment one of the redundant n-type floating gate transistors is eliminated from FIG. 13. In another alternative embodiment one of the redundant p-type floating gate transistors is eliminated from FIG. 13.

Figure 14:
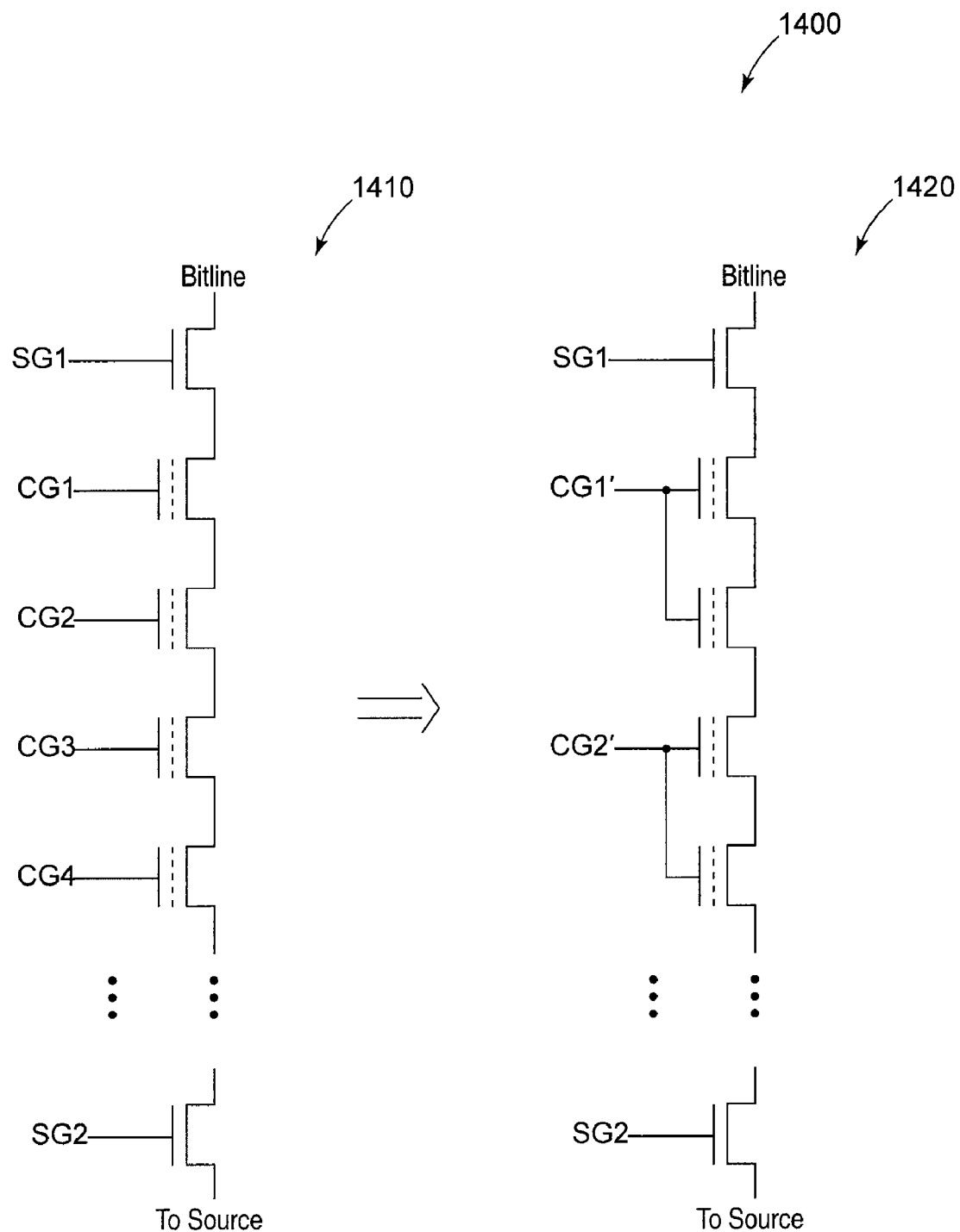
FIG. 14 is a schematic diagram illustrating the conversion of a floating gate NAND circuit to a redundant floating gate NAND circuit.

FIG. 14 is a schematic diagram (1400) illustrating the conversion of a floating gate NAND circuit (1410) to a redundant floating gate NAND circuit (1420). The floating gate NAND circuit (1410) includes a stack of series coupled n-type floating gate transistors, with a common bitline connection, each of the transistors having a separate gate control signal (CG1 . . . CGN), and series switches designated by SG1 and SG2. After converting the floating gate NAND circuit (1410) to a redundant floating gate structure (1420), each of the floating gate transistor devices is replaced by a series coupled floating gate device with a common gate connection to a control signal (CG1' . . . SGN'). The memory transistors (or floating gate transistors) could be implemented as either n-type or p-type floating gate devices.

Figure 15:
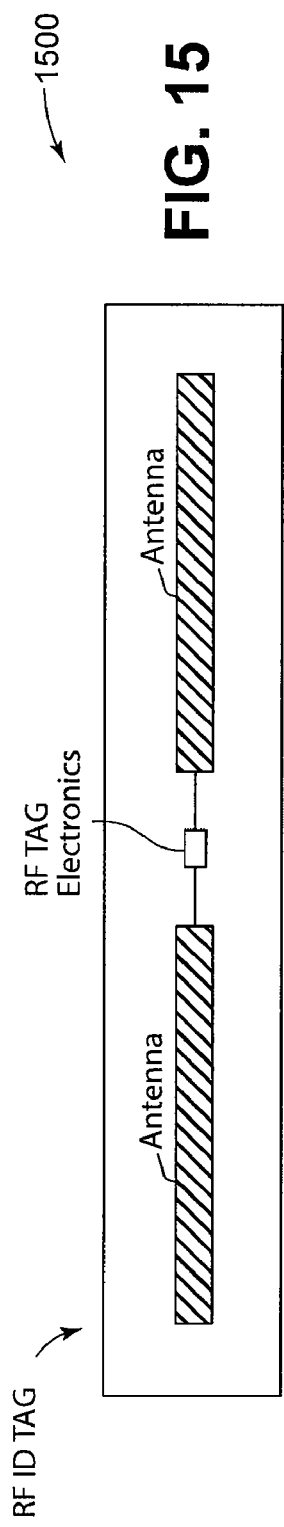
FIG. 15 is a diagram illustrating components of a radio frequency identification tag (RFID tag)

FIG. 15 is a diagram illustrating components of a radio frequency identification tag (RFID tag 1500) that may be adapted for use with a redundant NVM circuit. The RFID tag RF tag electronics that are in electrical communication with an antenna such as a dipole, microstrip, or stripline antenna.

Figure 16:
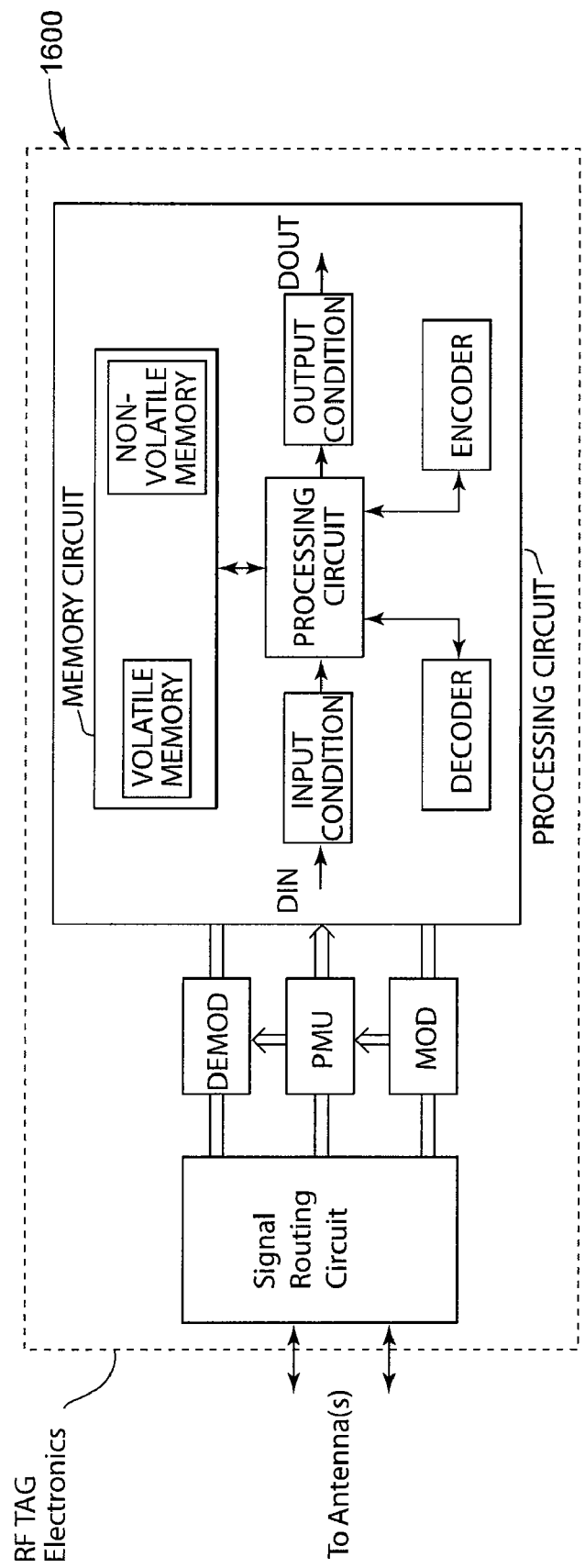
FIG. 16 is a block diagram illustrating example electronics for the RFID tag illustrated in FIG. 15, where the electronics include a redundant NVM circuit.

FIG. 16 is a block diagram illustrating example electronics (1600) for the RFID tag illustrated in FIG. 15, where the electronics include a redundant NVM circuit. The RF tag electronics include a signal routing circuit that is arranged to switch signals between the antenna(s) and other components such as a demodulator, a modulator, and a power management unit. The demodulator, modulator, and power management unit are also in electrical communication with the processing circuit. The processing circuit includes a memory circuit, and additional circuits such as an input conditioning circuit, a processing circuit, an output conditioning circuit, a decoder, and an encoder. The memory circuit may include both volatile and non-volatile memory types, where the non-volatile memory is a redundant memory such as described in the present disclosure.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A non-volatile memory (NYM) circuit, comprising:
a first field effect transistor (FET) circuit of a first type, wherein the first FET circuit includes a first floating gate terminal configured to be programmed to an "on" state or an "off" state; and
a second FET circuit of the first type, wherein the first FET circuit is arranged in a redundant circuit configuration with respect to the second FET circuit, the second FET circuit includes a second floating gate terminal configured to be programmed to an "on" state or an "off" state, and wherein the redundant circuit configuration is configured to cause the first and second FET circuit to assume the same "on" or "off" state upon programming.

2. The NVM circuit of claim 1, wherein the redundant circuit configuration comprises at least one of: a parallel configuration and a series configuration.

3. The NVM circuit of claim 1, wherein the first type corresponds to at least one of a p-type and an n-type.

4. The NVM circuit of claim 1, wherein the first and second FET arrangement is configured to operate as a portion of at least one of: an NVM circuit associated with an RFID tag, a one-dimensional NVM array, a two-dimensional NVM array, a NAND circuit, a NOR circuit, a NAND NVM array circuit, a NOR NVM array circuit, an inverter NVM circuit, and a logic circuit.

5. The NVM circuit of claim 1, further comprising a cell selection circuit that is coupled to the first FET and the second FET circuit.

6. The NVM circuit of claim 1, further comprising a cell selection circuit that is coupled to at least one of the first FET circuit and the second FET circuit.

7. The NVM circuit of claim 1, wherein a first floating gate associated with the first FET circuit and a second floating gate associated with the second FET circuit each comprise at least one of: a polysilicon material from a single poly process, and a polysilicon material from a double poly process.

8. The NVM circuit of claim 1, a cell selection circuit that is arranged to select at least one of the first FET circuit and the second FET circuit for operation.

9. The NVM circuit of claim 8, wherein the cell selection circuit is coupled between a power terminal and at least one of the first and second FET circuits, and wherein the cell selection circuit comprises at least one of: a resistor, a first current source, a selectable current source, a first switching circuit, a second current source in series with a second switching circuit, and a biased transistor in series with a third switching circuit.

10. The NVM circuit of claim 1, wherein the first FET circuit and the second FET circuit are arranged in a shared region of material of a second type that is different from the first type.

11. The NVM circuit of claim 10, wherein the region of material corresponds to at least one of: a substrate region of the second type, and a well region of a second type that is formed on a substrate of the first type.

12. The NVM circuit of claim 10, wherein the first type is associated with a p-type material and the second type is associated with an n-type material.

13. The NVM circuit of claim 1, further comprising: a current sense circuit that is arranged to sense an output associated with at least one of the first FET circuit and second FET circuit.

14. The NVM circuit of claim 13, further comprising:
a third FET circuit of the first type that is coupled to the first floating gate terminal; and
a fourth FET circuit of the first type that is coupled to the second floating gate terminal, wherein the third FET circuit is arranged in the redundant circuit configuration with the fourth FET circuit.

15. The NVM circuit of claim 13, further comprising:
a third FET circuit of the first type that is coupled to the first floating gate terminal;
a fourth FET circuit of the first type that is coupled to the second floating gate terminal;
a current source circuit that is coupled to the third and fourth FET circuits; and
a sense circuit that is coupled to the third and fourth FET circuits.

16. The NVM circuit of claim 13, further comprising:
a third FET circuit of the first type, wherein the third FET circuit includes a first sense gate terminal that is coupled to the first floating gate terminal; and
a fourth FET circuit of the first type, wherein the fourth FET circuit includes a second sense gate terminal that is coupled to the second floating gate terminal.

17. The NVM circuit of claim 1, further comprising:
a first charge control circuit that is arranged to adjust charge associated with the first floating gate terminal; and
a second charge control circuit that is arranged to adjust charge associated with the second floating gate terminal.

18. The NVM circuit of claim 17, wherein the first charge control circuit and the second charge control circuit each comprise a capacitor circuit.

19. The NVM circuit of claim 17, wherein the first charge control circuit and the second charge control circuit each comprise a capacitor circuit that share a common input.

20. The NVM circuit of claim 17, wherein the first charge control circuit and the second charge control circuit each comprise a capacitor circuit that is arranged to tunnel electrons to a respective one of the floating gate terminals.

21. The NVM circuit of claim 17, wherein the first charge control circuit and the second charge control circuit are arranged to provide at least one of: Fowler-Nordheim (FN) tunneling, and direct tunneling.

22. The NVM circuit of claim 17, wherein the first charge control circuit and the second charge control circuit each comprise a capacitor circuit that corresponds to at least one of: a polysilicon over substrate based capacitor, a polysilicon over polysilicon based capacitor, a metal over substrate based capacitor, a metal over metal based capacitor, and a FET based capacitor.

23. The NVM circuit of claim 17, wherein the first charge control circuit and the second charge control circuit each comprise a charge injection circuit that is configured for at least one of: hot electron injection, hot hole injection, channel hot electron injection, channel hot hole injection, substrate hot electron injection, substrate hot hole injection, impact ionization generated hot electron injection, and impact ionization generated hot hole injection.

24. The NVYM circuit of claim 17, wherein the first charge control circuit and the second charge control circuit are combined into a shared charge control circuit.

25. The NVM circuit of claim 1, further comprising:
a third FET circuit coupled to a third floating gate terminal and configured to be programmed to an "on" state or an "off" state; and
a fourth FET circuit coupled to a fourth floating gate terminal and configured to be programmed to an "on" state or an "off" state, wherein the third FET circuit is arranged in a redundant circuit configuration with respect to the fourth FET circuit configured to be programmed to an "on" state or an "off" state, and wherein the redundant circuit configuration is configured to cause the third and fourth FET circuit to assume the same "on" or "off" state upon programming.

26. The NVM circuit of claim 25, wherein the first FET circuit and the second FET circuit are further arranged as a first half of a differential NYM circuit, and wherein the third FET circuit and the fourth FET circuit are further arranged as a second half of the differential NYM circuit.

27. The NVM circuit of claim 17, further comprising:
a fifth FET circuit configured to selectively couple the first and second FET arrangement to the third and fourth FET arrangement for differential operation, and also arranged to decouple the first and second FET arrangement from the third and fourth FET arrangement for non-differential operation.

28. The NVM circuit of claim 17, further comprising:
a differential current sense circuit that is coupled to the first, second, third, and fourth FET circuits.

29. The NVM circuit of claim 17, wherein the first and second FET arrangement is configured to operate with the third and fourth FET arrangements as a portion of at least one of: an NVM circuit associated with an RFID tag, a one-dimensional NVM array, a two-dimensional NVM array, a NAND circuit, a NOR circuit, a NAND array circuit, a NOR array circuit, an inverter circuit, and a logic circuit.

30. The NVM circuit of claim 17, wherein the third and fourth FET circuits are of a second type that is one of: the same as the first type, and different from the first type.

31. The NVM circuit of claim 1, further comprising:
a third FET circuit of the first type, wherein the third FET circuit is arranged in a redundant circuit configuration with respect to the first and second FET circuits, and wherein the third FET circuit includes a third floating gate terminal.

32. The NVM circuit of claim 1, wherein at least one of the first and second FET circuits includes a charge trapping structure that comprises at least one of: a silicon nano-crystal device, and a SONOS device.

33. A non-volatile memory (NVM) circuit, comprising:
a first floating gate field effect transistor (FET) circuit of a first type configured to be programmed to an "on" state or an "off" state, wherein the first FET circuit includes a first floating gate terminal;
a second FET floating gate FET circuit of the first type, configured to be programmed to an "on" state or an "off" state, wherein the second FET circuit includes a second floating gate terminal; and
a redundant configuration means for configuring the first FET circuit in a redundant circuit configuration with respect to the second FET circuit, wherein the redundant configuration means is configured to cause the first and second FET circuit to assume the same "on" or "off" state upon programming.

34. The NVM circuit of claim 33, further comprising:
a charge control means that is coupled to at least one of the first and second floating gate terminals, wherein the charge control means is arranged to selectively program at least one of the first and second FET circuits.

35. The NVM circuit of claim 33, wherein the redundant configuration means is arranged to selectively configure the NVM circuit for operation as one of: a single ended NVM circuit and a differential NVM circuit.

* * * * *